(12) United States Patent
Lapok et al.

(10) Patent No.: US 10,407,948 B2
(45) Date of Patent: Sep. 10, 2019

(54) DETECTION DEVICE FOR DETECTING MECHANICAL FUNCTIONAL STATES OF A MOTOR VEHICLE LOCK

(71) Applicant: Brose Fahrzeugteile GmbH & Co. KG, Hallstadt, Hallstadt (DE)

(72) Inventors: Paul Lapok, Wuppertal (DE); Joerg Reinert, Remscheid (DE); Abdelali El-Hamoumi, Wuppertal (DE)

(73) Assignee: Brose Fahrzeugtelle GmbH & Co. KG, Hallstadt, Hallstadt (DE)

( * ) Notice: Subject to any disclaimer, the term of this patent is extended or adjusted under 35 U.S.C. 154(b) by 688 days.

(21) Appl. No.: 14/899,739

(22) PCT Filed: Jun. 20, 2014

(86) PCT No.: PCT/EP2014/062984
§ 371 (c)(1),
(2) Date: Dec. 18, 2015

(87) PCT Pub. No.: WO2014/202742
PCT Pub. Date: Dec. 24, 2014

(65) Prior Publication Data
US 2016/0145908 A1 May 26, 2016

(30) Foreign Application Priority Data
Jun. 19, 2013 (DE) .................. 10 2013 106 398

(51) Int. Cl.
*E05B 81/72* (2014.01)
*G01R 27/02* (2006.01)
(Continued)

(52) U.S. Cl.
CPC ............... *E05B 81/72* (2013.01); *B60J 5/00* (2013.01); *E05B 77/54* (2013.01); *E05B 81/04* (2013.01);
(Continued)

(58) Field of Classification Search
CPC ...... G01N 27/041; G01N 27/06; G01N 27/20; G01N 27/04; G01N 27/02; E05B 81/72; G01D 5/16; G01R 27/02
(Continued)

(56) References Cited

U.S. PATENT DOCUMENTS 4,447,752 A * 5/1984 Boyce .................... H01R 39/24
310/232
5,475,366 A * 12/1995 Van Lente ................ B60R 1/04
340/12.54

(Continued)

FOREIGN PATENT DOCUMENTS

DE 19917789 12/1999
DE 10360422 7/2005
(Continued)

OTHER PUBLICATIONS

"German Search Report," for German Patent Application No. 102013106398.5 dated Jun. 19, 2013 (6 pages), no translation available.
(Continued)

*Primary Examiner* — Christopher P McAndrew
(74) *Attorney, Agent, or Firm* — Pauly, DeVries Smith & Deffner LLC (57) ABSTRACT

The invention relates to a detection device for detecting mechanical functional states of a motor vehicle lock, in which at least two binary signal outputs are provided which define a logical state of the detection device through the respective electrical potentials present there. It is proposed that the functional state of the motor vehicle lock is determined on the basis of the logical state of the signal outputs and of the electrical resistance between the predetermined signal outputs.

20 Claims, 4 Drawing Sheets

(51) Int. Cl.
*E05B 77/54* (2014.01)
*E05B 81/62* (2014.01)
*H01H 47/00* (2006.01)
*E05B 81/64* (2014.01)
*E05B 81/54* (2014.01)
*B60J 5/00* (2006.01)
*E05B 81/04* (2014.01)
*G01D 5/16* (2006.01)
*E05B 81/66* (2014.01)
*E05B 15/04* (2006.01)

(52) U.S. Cl.
CPC .............. *E05B 81/54* (2013.01); *E05B 81/62* (2013.01); *E05B 81/64* (2013.01); *G01D 5/16* (2013.01); *G01R 27/02* (2013.01); *H01H 47/001* (2013.01); *E05B 81/66* (2013.01); *E05B 2015/0496* (2013.01)

(58) Field of Classification Search
USPC .................................................. 324/162, 693
See application file for complete search history.

(56) References Cited

U.S. PATENT DOCUMENTS

| | | | | |
|---|---|---|---|---|
| 5,614,885 A | * | 3/1997 | Van Lente | ................ B60R 1/04 340/12.28 |
| 6,115,229 A | * | 9/2000 | Ahlig | .................... H03K 17/97 361/179 |
| 6,236,121 B1 | * | 5/2001 | Kemmann | .............. B60R 25/04 180/287 |
| 8,727,398 B2 | | 5/2014 | Brose et al. | |
| 9,046,439 B2 | | 6/2015 | Taurasi et al. | |
| 2004/0135378 A1 | * | 7/2004 | Buedding | ............... E05B 81/20 292/216 |
| 2006/0213242 A1 | * | 9/2006 | Roesslinger | ........... E05B 81/66 70/432 |
| 2006/0249974 A1 | * | 11/2006 | Platzkoester | ........... E05F 15/63 296/76 |
| 2009/0076687 A1 | * | 3/2009 | Enache | ................. E05F 15/622 701/49 |
| 2012/0151840 A1 | * | 6/2012 | Scheler | ................... E05B 83/18 49/358 |
| 2012/0285087 A1 | * | 11/2012 | Eggeling | ................ E05B 81/14 49/29 |

FOREIGN PATENT DOCUMENTS

| | | |
|---|---|---|
| DE | 202007008562 | 9/2007 |
| DE | 102009059084 | 6/2011 |
| EP | 2333208 | 6/2011 |
| JP | 11002051 A * | 1/1999 |
| JP | 11002051 A * | 1/1999 |

OTHER PUBLICATIONS

"International Search Report and Written Opinion," for PCT/EP2014/062984 dated Sep. 16, 2014 (9 pages), no translation available.

* cited by examiner

|    | F1 | F2 | F3 | F4 | F5 |
|----|----|----|----|----|----|
| S1 | 0  | 1  | 0  | 1  | 0  |
| S2 | 0  | 0  | 0  | 1  | 1  |

Fig. 4

DETECTION DEVICE FOR DETECTING MECHANICAL FUNCTIONAL STATES OF A MOTOR VEHICLE LOCK

CROSS-REFERENCE TO RELATED APPLICATIONS

This application is a national stage application under 35 U.S.C. 371 of Inter-national Patent Application Serial No. PCT/EP2014/062984, entitled "Erfassungseinrichtung für die Erfassung von mechanischen Funktionszustanden eines Kraftfahrzeugschlosses," filed Jun. 20, 2014, which claims priority from German Patent Application No. DE 10 2013 106 398.5, filed Jun. 19, 2013, the disclosures of which are incorporated herein by reference.

FIELD OF THE TECHNOLOGY

The application relates to a detection device for detecting mechanical functional states of a motor vehicle lock, a motor vehicle lock with such a detection device, and a method for detecting the mechanical functional state of a motor vehicle lock by means of such a detection device.

BACKGROUND

The motor vehicle lock under discussion is applicable to all kinds of closure elements of a motor vehicle. These include in particular side doors, rear doors, tailgates, trunk lids or engine hoods. These closure elements can in principle also be designed in the manner of sliding doors.

A motor vehicle lock as above comprises an entire range of adjustable functional elements which adopt different positions depending on the functional state of the motor vehicle lock.

The mechanical functional state of a motor vehicle lock can, for example, relate to a locking state such as "locked" or "unlocked". Depending on the locking state of the motor vehicle lock, the associated closure element can be opened by actuating an exterior door handle and/or an interior door handle. The functional state of a motor vehicle lock however also comprises the closing state of the motor vehicle lock. In the usual case in which the vehicle lock comprises a lock striker plate which, when the locking element executes a closing movement, engages with a lock striker or the like, the closing state comprises for example the position of the lock striker plate. In the case in which a safety catch is associated with the lock striker plate that fixes the lock striker plate into a locked position, the closing state also comprises the position of the safety catch.

The functional state of a motor vehicle lock can, in addition to the locking state and the closing state, also comprise other states that will not be considered in any further detail.

A detection device is regularly provided for detecting mechanical functional states of a motor vehicle lock. The known detection device (EP 2 333 208 A2), on which the invention is based, is fitted with a sensor arrangement consisting of two sensor switches which detect the position of two functional elements, here the lock striker plate and the safety catch. The detection device comprises two binary signal outputs through to which a reference potential is switched depending on the functional state, here the closing state of the motor vehicle lock. The resulting functional state of the motor vehicle lock is determined by means of a control arrangement from the logical state of the signal outputs.

A particularly fault-resistant detection of functional states of the motor vehicle lock is possible with the known detection device. There is a potential for optimization in respect of increasing the number of detectable functional states with the smallest possible number of binary signal outputs.

SUMMARY

The application is therefore based on the problem of configuring and developing the known detection device in such a way that the number of functional states that are detectable with a given number of binary signal outputs is increased.

The above problem is solved by a detection device as described herein.

Important here is the basic consideration, that not only the logical state of signal outputs, but also that, with an appropriate configuration of the detection device, the electrical resistance between signal outputs can comprise a certain information content.

It is first proposed that, in the assembled state, at least two functional states of the motor vehicle lock generate one and the same logical state of the detection device, said logical state being referred to below as a "multiple state".

What is important is that the functional states that lead to one and the same logical state of the detection device are distinguishable in that the electrical resistance between two predetermined signal outputs of the detection device differs depending on the respective functional state. To exploit this it is further proposed that the control arrangement determines the functional state of the motor vehicle lock not only on the basis of the logical state of the signal outputs, but also on the basis of the electrical resistance between predetermined signal outputs.

The additional information content which can be traced back to the electrical resistance between the predetermined signal outputs allows the number of detectable mechanical functional states to be increased without this entailing an increase in the complexity of the detection device.

It is for example provided the detection device comprises precisely two signal outputs, where precisely one multiple state is provided. The multiple state corresponds to a functional state of the motor vehicle lock with a first resistance value between the two signal outputs, and to another functional state of the motor vehicle lock with a second resistance value between the two signal outputs. Altogether a total of five functional states of the motor vehicle lock can be represented with the two, binary signal outputs.

A detection device according to this proposal can be implemented with very different circuit arrangements. In various embodiments, the detection device is designed with a sensor arrangement with at least two sensor switches. A particularly economical arrangement is conceivable here, in particular if the sensor switches are simple microswitches or the like.

Advantageously the detection device can also comprise a sensor arrangement, which is designed as a slip ring arrangement. A detection device of this sort can be designed in a particularly compact manner.

According to a further teaching, a motor vehicle lock can include a lock mechanism that can be placed in various functional states, and with a detection device in accordance with the proposal. Reference may be made to all the explanations of the detection device according to the proposal.

A method for detecting mechanical functional states of a motor vehicle lock by means of a detection device is described.

The detection device used for the method according to the proposal comprises at least two binary signal outputs which, through the electrical potentials respectively present, define a logical state, in which each functional state of the motor vehicle lock generates a logical detection state of the detection device.

Important according to this further teaching is that the functional state of the motor vehicle lock is determined on the basis of the logical state of the signal outputs and of the electrical resistance between predetermined signal outputs. A method of this sort can also be implemented with a detection device according to the proposal, so that also to that extent reference may be made to all the explanations of the detection device according to the proposal.

An embodiment provides a detection device for detecting mechanical functional states of a motor vehicle lock, in which at least two binary signal outputs are provided which define a logical state of the detection device through the respective electrical potentials present there, in which, in the assembled state, each functional state of the motor vehicle lock generates a logical state of the detection device, and in which a control arrangement is provided which is coupled electrically with the signal outputs and, on the basis of this coupling, determines the functional state of the motor vehicle lock, wherein in the assembled state, at least two functional states of the motor vehicle lock generate one and the same logical state—multiple state—of the detection device, that these functional states are distinguishable in that the electrical resistance between two predetermined signal outputs of the detection device differs depending on the respective functional state of the motor vehicle lock, and that the control arrangement determines the functional state of the motor vehicle lock on the basis of the logical state of the signal outputs and of the electrical resistance between the predetermined signal outputs.

In an embodiment, the electrical resistance between the two predetermined signal outputs corresponds to an electrically conductive connection or tends to infinity, depending on the respective functional state.

In an embodiment, the detection device comprises precisely two signal outputs, and that precisely one multiple state is provided, or that the detection device comprises more than two signal outputs, and at least two multiple states are provided.

In an embodiment, the detection device comprises a sensor arrangement which makes the signal outputs of the detection device available.

In an embodiment, an electrical reference potential, in particular ground potential, is provided, and that the sensor arrangement connects the reference potential through to the signal outputs to set a logical state, such that the sensor arrangement in the assembled state connects the reference potential through to the signal outputs depending on the current functional state of the motor vehicle lock.

In an embodiment, the detection device, when in the assembled state, is associated with at least one adjustable functional element of the motor vehicle lock, and that the logical state of the detection device is determined by the position of the at least one functional element.

In an embodiment, the sensor arrangement comprises at least two sensor switches, in particular changeover switches which, in the assembled state, interact with the at least one functional element of the motor vehicle lock, and whose switching states are determined by the position of the at least one functional element.

In an embodiment, the center contacts of the changeover switches each form one signal output, and that a first switch contact of a first changeover switch is connected to a first switch contact of a second changeover switch, such that a second switch contact of the first changeover switch and a second switch contact of the second changeover switch is connected to a reference potential, in particular to ground potential, such that at least one of the changeover switches has a center position in which the center contact is connected with a third switch contact, such that the center contact does not have the reference potential applied to it when in the center position.

In an embodiment, the sensor arrangement is designed as a sliding track arrangement with sliding tracks designed to be electrically separate from one another, and with a sliding contact which can be repositioned relative to the sliding tracks, and that the sliding contact connects the sliding tracks electrically depending on the position, such that the sliding contact or the sliding tracks interacts or interact with at least one functional element of the motor vehicle lock, and the position of the sliding contact or of the sliding tracks is determined through the position of the functional element.

In an embodiment, at least two, such as precisely two, sliding tracks constitute a signal output of the detection device, advantageously that the reference potential, in particular the ground potential is applied to one sliding track.

An embodiment provides a motor vehicle lock with a lock mechanism which can be placed in different functional states, and with a detection device for detecting mechanical functional states as described herein.

In an embodiment, the detection device in the assembled state is associated with at least one adjustable functional element of the motor vehicle lock, and that the logical state of the detection device is determined by the position of the at least one functional element, such that the lock mechanism, and with that the motor vehicle lock, can be placed in different functional states such as "locked", "unlocked", "theft-protected", "locked and child-safe" and "unlocked and child-safe".

In an embodiment, the functional element which is associated with the sensor arrangement of the detection device is designed as a control shaft with at least one axial control section for routing control movements out.

In an embodiment, the sensor arrangement is designed as a sliding track arrangement, in particular as a slip ring arrangement, with at least three sliding tracks designed to be electrically separate from one another, and with a sliding contact which can be repositioned relative to the sliding tracks, that the sliding contact connects the sliding tracks electrically depending on the position, such that the sliding track arrangement designed as a slip ring arrangement is positioned concentrically on the control shaft.

An embodiment provides a method for detecting mechanical functional states of a motor vehicle lock by means of a detection device, in particular by means of a detection device as described herein, in which the detection device comprises at least two binary signal outputs which, through the electrical potentials respectively present, define a logical state of the detection device, in which each functional state of the motor vehicle lock generates a logical state of the detection device, wherein the functional state of the motor vehicle lock is determined on the basis of the logical state of the signal outputs and of the electrical resistance between predetermined signal outputs.

BRIEF DESCRIPTION OF THE FIGURES

The invention is explained in more detail below with reference to a drawing that illustrates an exemplary embodiment. In the drawing

DETAILED DESCRIPTION

Figure 1:
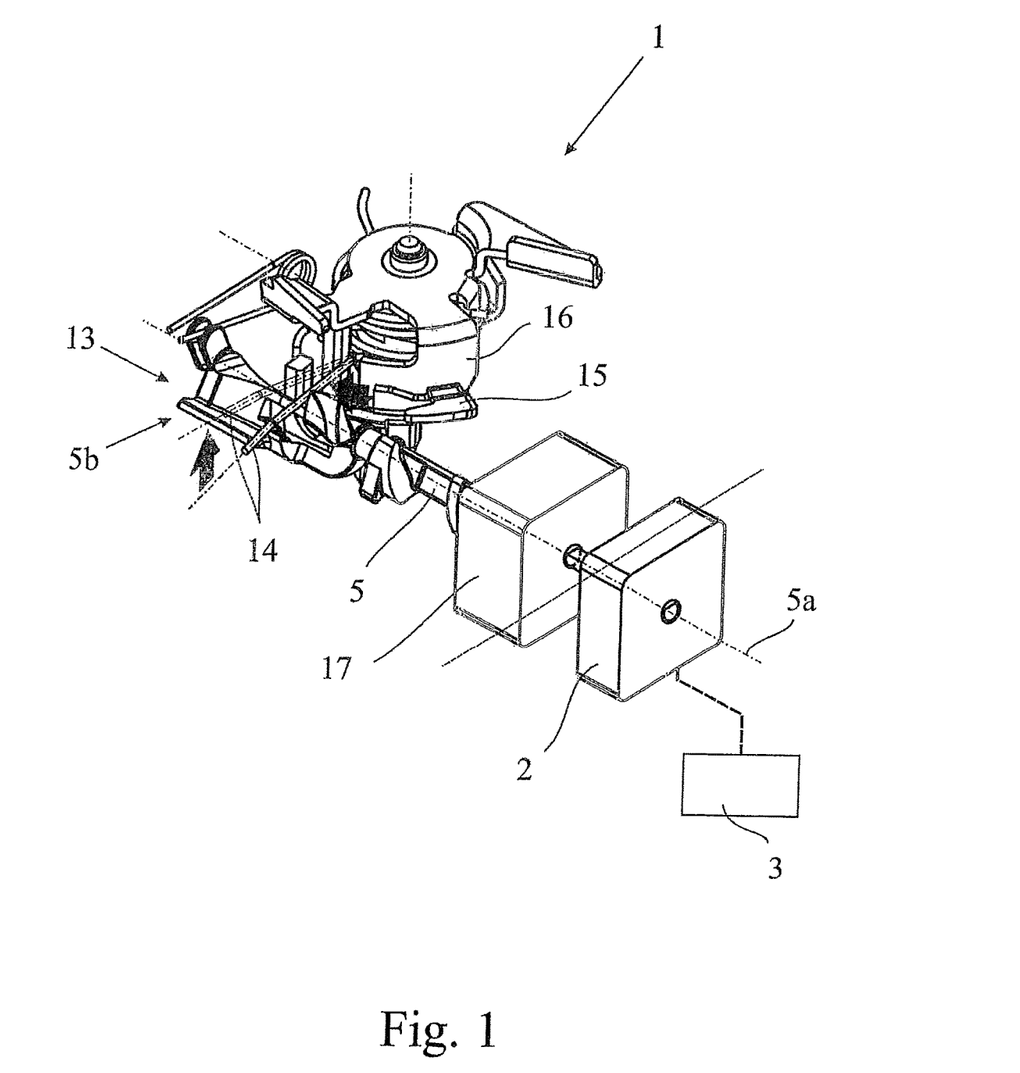
FIG. 1 shows a detection device according to the proposal that is mounted in a motor vehicle lock according to the proposal.

The motor vehicle lock 1 according to the proposal illustrated in FIG. 1 is fitted with a detection device 2 according to the proposal. The detection device 2 serves to detect mechanical functional states of the motor vehicle lock 1. A motor vehicle lock 1 of this sort can adopt various functional states, depending on its design, as was explained in the introductory part of the description.

Figure 2:
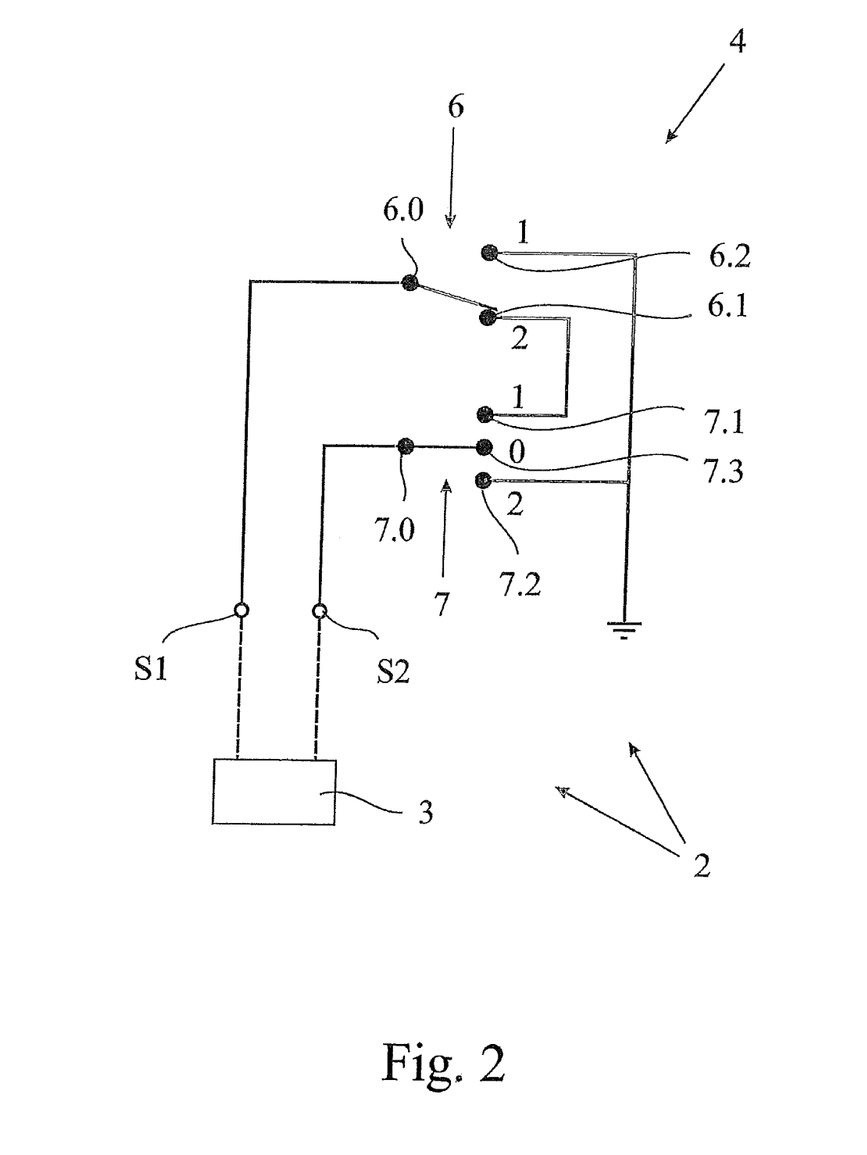
FIG. 2 shows a sensor arrangement and a control arrangement of the detection device according to FIG. 1 in a first embodiment.
Figure 3:
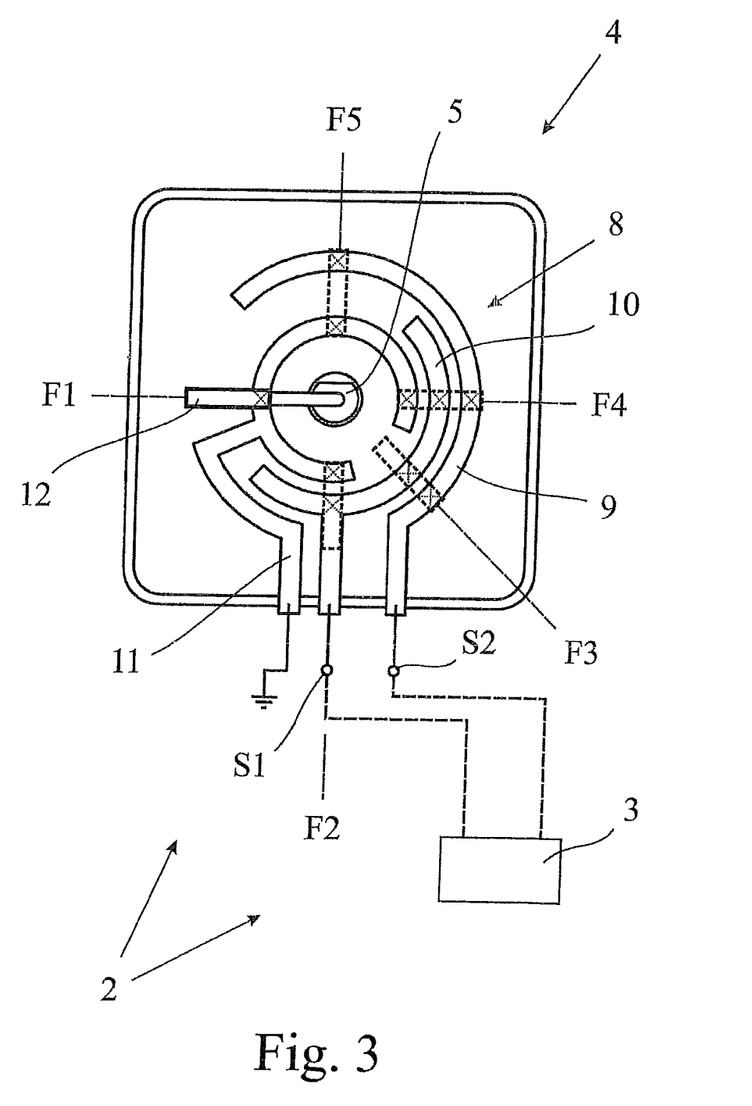
FIG. 3 shows a sensor arrangement and a control arrangement of the detection device according to FIG. 1 in a further embodiment.

The detection device comprises at least two, in this case precisely two, binary signal outputs S1, S2. "Binary signal output" here means that the signal output can adopt precisely two logical states through the electrical potential present at the signal output. For example the signal outputs S1, S2 illustrated in FIGS. 2, 3 are connected to the ground potential M or disconnected from the ground potential M. The state connected with the ground potential M here corresponds to the binary state "1", whereas the state disconnected from the ground potential M corresponds to the logical state "0". It is also conceivable that a positive potential or a negative potential is present at the signal outputs S1, S2 depending on the respective logical state.

The detection device 2 is further fitted with a control arrangement 3 which is electrically coupled to the signal outputs S1, S2 and, on the basis of this coupling, determines the functional state of the motor vehicle lock 1. The control arrangement 3 can in principle be associated spatially with the motor vehicle lock 1. It is also however conceivable that the control arrangement is an element of a central motor vehicle controller or the like.

Figure 4:
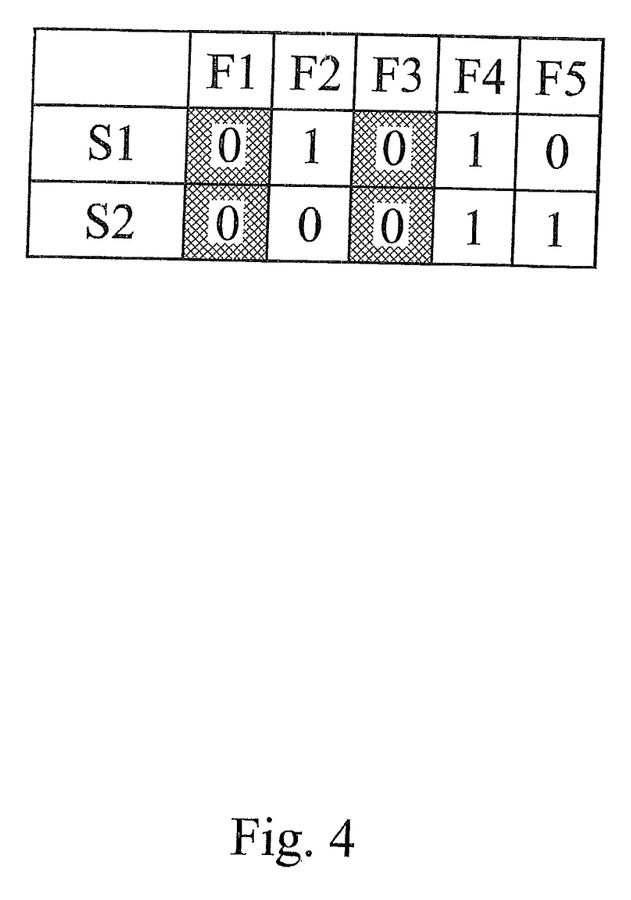
FIG. 4 shows a state diagram that can be applied to the sensor arrangements illustrated in FIG. 2 and FIG. 3.

FIG. 4 shows a state diagram from which the relationship between five functional states F1-F5 of the motor vehicle lock 1 to the logical states of the signal outputs S1, S2 can be taken. It is clear here that two functional states, namely functional states F1 and F3 generate one and the same logical state, namely S1: "0" and S2: "0". As suggested above, this logical state is referred to here as a "multiple state".

What is important for the teaching according to the proposal is that the functional states of the motor vehicle lock 1 that cause the one logical multiple state of the detection device 2 are distinguishable in that the electrical resistance between two predetermined signal outputs S1, S2 of the detection device 2 differs depending on the respective functional state. Accordingly it is the case according to the proposal that the control arrangement 3 determines the functional state of the motor vehicle lock 1 on the basis of the logical state of the signal outputs S1, S2 and of the electrical resistance between the predetermined signal outputs S1, S2. Through taking into account the electrical resistance between the two signal outputs S1, S2, it is possible to represent an additional functional state as compared with the usual binary coding of a pair of signal outputs.

The electrical resistance between the signal outputs S1, S2 can be taken into account through a measurement of the concrete resistance value. Here it is however the case that the signal outputs S1, S2 are only checked for whether an electrically conductive connection exists between them or no electrically conductive connection exists. Accordingly the circuitry can provide the electrical resistance between the two predetermined signal outputs S1, S2 depending on the respective functional state of the motor vehicle lock 1, corresponds to an electrically conductive connection or on the other hand tends to infinity.

In the exemplary embodiments illustrated in FIGS. 2 and 3, precisely two signal outputs S1, S2, and precisely one multiple state are provided. Taking a resistance into account accordingly only comes into question between the signal outputs S1, S2.

The solution according to the proposal can, however, also be applied to a detection device 2 with more than two signal outputs, where, in a manner involving simple circuitry, at least two multiple states can be realized with the associated, additionally detectable, functional states of the motor vehicle lock 1.

The detection device 2 according to the proposal is fitted with a sensor arrangement 4 which makes the signal outputs S1, S2 of the detection device 2 available. The term "sensor arrangement" is to be understood here broadly, and comprises both complex state sensors with integrated signal evaluation as well as simple switching arrangements as will be explained further below.

An arrangement involving simple circuitry can be achieved in that an electrical reference potential M, in this case the ground potential M, is provided, where the sensor arrangement 4 connects the reference potential M through the signal outputs S1, S2 to set a logical state. In detail, here it is the case that the sensor arrangement 4 connects the reference potential M through to the signal outputs S1, S2 depending on the current functional state of the motor vehicle lock 1. It is, however, also conceivable, as explained above, that different electrical potentials are connected through to the signal outputs S1, S2, depending on the current functional state of the motor vehicle lock 1.

To detect the functional state of the motor vehicle lock 1, the detection device 2 in the assembled state is associated with at least one adjustable functional element 5 here and optionally implemented as the control shaft 5 of the motor vehicle lock 1. What is important here is that the logical state of the detection device 2 is determined by the position of the at least one functional element 5. Here, as in the exemplary embodiments illustrated, a mechanical coupling is provided between the functional element 5 and the detection device 2. In principle, however, a contactless coupling is also conceivable, for example if the sensor arrangement 4 comprises proximity sensors or the like.

FIGS. 2 and 3 illustrate two advantageous variants for the design of the sensor arrangement 4 of the detection device 2 with which the functional element 5 is associated.

FIG. 2 shows that the sensor arrangement 4 comprises two sensor switches, here implemented as changeover switches 6, 7. To implement more than two signal outputs S1, S2, it is also possible for more than two sensor switches to be provided.

The changeover switches 6, 7 in the assembled state act together with the at least one functional element 5 of the motor vehicle lock 1, where their switching states are determined by the position of the functional element 5. The changeover switches 6, 7 can, for example, be arranged in the housing of the detection device 2 illustrated in FIG. 1. It is conceivable in this connection that the functional element 5 designed as a control shaft comprises cams that act together with the two changeover switches 6, 7. Both changeover switches 6, 7 are provided with a center contact 6.0, 7.0 and with switch contacts 6.1, 6.2, 7.1, 7.2, where the respective center contact 6.0, 7.0 is connected to the associated switch contact 6.1, 6.2, 7.1, 7.2 in accordance with the switching position. In the exemplary embodiment illustrated in FIG. 2, it is the case that the center contacts 6.0, 7.0 of the changeover switches 6, 7 each constitute a signal output S1, S2, where a first switch contact 6.1 of the first changeover switch 6 is connected with a first switch contact 7.1 of the second changeover switch 7. With this connection, the electrical resistance between the two signal output S1, S2 described herein can be changed to implement a further logical state through a switching process.

Further, a second switch contact 6.2 of the first changeover switch 6 and a second switch contact 7.2 of the second changeover switch 7 is connected to a reference potential M, here to the ground potential M. This makes it possible for the reference potential M to be connected through to the two signal outputs S1, S2.

The two changeover switches 6, 7 can be placed into two switch positions, depending on the position of the functional element 5, where the center contact 6.0, 7.0 is either connected to the first switch contact 6.1, 7.1, or to the second switch contact 6.2, 7.2.

In the exemplary embodiment illustrated in FIG. 2, it is furthermore the case that at least one of the changeover switches 6, 7, here the second changeover switch 7, has a center position in which the center contact 7.0 is connected with a third switch contact 7.3, where the center contact 7.0 does not have the reference potential M applied to it when in the center position.

The possible logical states of the detection device according to FIG. 2 can be seen in the state diagram according to FIG. 4, on the assumption that applying the ground potential M to the signal outputs S1, S2, corresponds to the logical state "1".

The logical multiple state S1: "0", S2: "0" of the detection device 2, which corresponds to the two functional states F1 and F3, is interesting. Here the center contact 6.0 of the first changeover switch 6 is connected to the first switch contact 6.1, while the center contact 7.0 of the second changeover switch 7 is connected to the first switch contact 7.1 or to the third switch contact 7.3. The logical state S1: "0", S2: "0" results in the two last cases. These two functional states can however be distinguished, in that, in the case in which the center contact 7.0 is connected to the first switch contact 7.1, the two signal outputs S1, S2 have an electrically conductive connection, and in the case in which the center contact 7.0 is connected to the third switch contact 7.3, the two signal outputs S1, S2 are isolated from one another. This change in the resistance between the signal outputs S1, S2 is detected according to the proposal by the control arrangement 3, and is taken into account when determining the functional state of the motor vehicle lock 1.

A constructive variant of the sensor arrangement 4 according to FIG. 2 is shown in FIG. 3. Here the sensor arrangement 4 is designed as a slip ring arrangement 8, with sliding tracks 9, 10, 11 designed to be electrically separated from one another, and with a sliding contact 12 that can be repositioned relative to the sliding tracks 9, 10, 11. In an embodiment, at least three such sliding tracks 9, 10, 11 are provided. Here the sliding track arrangement comprises precisely three sliding tracks 9, 10, 11 designed to be electrically separate from one another.

The sliding contact 12 is designed and arranged such that it connects the sliding tracks 9, 10, 11 together electrically depending on the position of the sliding contact 12. Here it is the case that the sliding contact 12 interacts with at least one functional element 5, further with the functional element 5 embodied as a control shaft, wherein the position of the sliding contact 12 is determined in accordance with the position of the functional element 5. Conversely it can also be advantageous for the sliding tracks 9, 10, 11 to interact with the functional element 5 such that the position of the sliding tracks 9, 10, 11 is determined by the position of the functional element 5, while the sliding contact 12 remains stationary. The sliding track arrangement 8 can be located in the housing of the detection device 2 illustrated in FIG. 1.

For the sake of a compact design, the sliding track arrangement 8 is designed as a slip ring arrangement 8, so that the sliding tracks 9, 10, 11 follow at least in part the path of a circle. In an embodiment, the sliding track arrangement 8 here designed as a slip ring arrangement is positioned concentrically on the control shaft axis 5a of the functional element 5 designed as a control shaft. The sliding contact 12 here can pivot around a pivot axis that corresponds geometrically to the control element axis 5a.

An entire range of advantageous possibilities for the electrical connection of the sliding track arrangement 8 is conceivable. In the exemplary embodiment illustrated in FIG. 3, at least two, here precisely two, sliding tracks 9, 10 respectively constitute one signal output S1, S2 of the detection device 2, while the reference potential M, here the ground potential M, is applied to the third remaining sliding track 11.

The switching behavior of the sliding track arrangement 8 illustrated in FIG. 3 is identical to the switching behavior of the switching arrangement of two changeover switches 6, 7 illustrated in FIG. 2. To that extent the state diagram illustrated in FIG. 4 can also be applied to the sliding track arrangement 8 illustrated in FIG. 3. The multiple state of the detection device 2, which occurs in the functional states F1 and F3 of the motor vehicle lock, is again interesting here. It can be seen from the illustration according to FIG. 3, that the sliding contact 12 in functional state F1 is only connected to the sliding track 11, i.e. to the ground potential M, while the sliding contact 12 in functional state F3 is in contact with the two sliding tracks 9, 10, connecting them electrically. As a result the two signal outputs S1, S2 are electrically separate from each other in functional state F1, and are electrically connected to one another in functional state F3, which in turn is used by the control arrangement 3 to distinguish the two functional states F1 and F3.

In this context it should be pointed out that only those components of the motor vehicle lock 1 according to the proposal that are necessary to explain the teaching are illustrated in the drawing. Accordingly, a lock striker plate which interacts in the usual manner with a locking bolt or the like, and which is held by means of a safety catch in a main locked position and, if relevant, in an available preliminary locked position, is not shown in the drawing.

The motor vehicle lock 1 comprises a lock mechanism 13 that can be placed in different functional states. The lock mechanism 13 primarily has a coupling function. A wire-like coupling element 14 is provided for this purpose, and can be brought into various coupling positions. In FIG. 1 a coupling position is shown by a continuous line, and a further coupling position by a dotted line. The coupling function consists primarily in that an interior actuation lever 15 and an exterior actuation lever 16 are coupled to the safety catch of the motor vehicle lock 1 or are decoupled from the safety catch of the motor vehicle lock 1 in such a way that the safety catch can be lifted by an actuation of one of the two actuation levers 15, 16, depending on the functional state of the motor vehicle lock 1.

The motor vehicle lock 1 according to the proposal is also fitted with a detection device 2 as above to detect mechanical functional states of the motor vehicle lock 1. To that extent reference may be made to all the explanations of the detection device 2 according to the proposal. As further explained above, at least one adjustable functional element 5 of the motor vehicle lock 1 is associated, in the assembled state illustrated in FIG. 1, with the detection device 2, where the logical state of the detection device 2 is determined by the position of the functional element 5.

In the exemplary embodiment illustrated in FIG. 1, the lock mechanism 13, and with that the motor vehicle lock 1, can be placed in different functional states such as "locked", "unlocked", "theft-protected", "locked and child-safe" and "unlocked and child-safe", where setting these altogether five functional states can be done by an appropriate repositioning of the functional element 5. The fact that with the proposed detection device 2, detecting this total of five functional states is possible with just two signal outputs S1, S2, is interesting.

Provided the interior actuation lever 15 is coupled with an interior door handle and the exterior actuation lever 16 is coupled with an exterior door handle, then different possibilities for opening the closure element associated with opening the motor vehicle lock 1, in particular the motor vehicle door associated with the motor vehicle lock 1, arise depending on the functional state. In the "locked" functional state, it is possible to open from the inside, but not from the outside. In the "unlocked" functional state, it is possible to open both from the inside and from the outside. In the "theft-protected" functional state, it is not possible to open either from the inside or from the outside. In the "locked and child-safe" functional state, it is possible to unlock from the inside, but not to open from either the inside or the outside. In the "unlocked and child-safe" functional state, it is possible to open from the outside, but not from the inside.

Purely for the sake of clarity it should be pointed out, with respect to the state diagram of FIG. 4, that F1 corresponds to the "unlocked" functional state, F2 to the "locked" functional state, F3 to the "theft-protected" functional state, F4 to the "locked and child-safe" functional state and F5 to the "unlocked and child-safe" functional state.

As a result, the proposed solution allows all the locking states usual for a motor vehicle lock to be represented with just two signal outputs S1, S2. This leads to a universal applicability of the proposed detection device 2 in the field of motor vehicle locks.

In particular, the embodiment of the detection device 2 with a sliding track arrangement 8 illustrated in FIG. 3 can be implemented in a particularly compact manner if, as explained above, the functional element 5 concerned is designed as a control shaft. Here the control shaft is designed with an axial control section 5b for routing control movements out, where the coupling element 14 is supported on the control section 5b of the functional element 5. In principle it is, however, also conceivable that the detection device 2 is associated with a functional element 5 or to a plurality of functional elements 5 which, for example, is or are designed like levers.

According to a further teaching the method for detecting mechanical functional states of a motor vehicle lock 1 by means of a detection device 2 is described herein.

The detection device 2 applied in the proposed method comprises at least two binary signal outputs S1, S2 which, through the electrical potentials respectively present, define a logical state of the detection device 2, in which each functional state of the motor vehicle lock 1 generates a logical state of the detection device 2.

Important according to the further teaching is that the functional state of the motor vehicle lock 1 is determined on the basis of the logical state of the signal outputs S1, S2 and of the electrical resistance between predetermined signal outputs S1, S2. In an embodiment, a detection device 2 according to the proposal as explained above is used. Reference may be made to all the explanations of the mode of operation of the detection device 2 according to the proposal.

The invention claimed is:

1. A detection device for detecting mechanical functional states of a motor vehicle lock, in which at least two binary signal outputs are provided which define a logical state of the detection device through the respective electrical potentials present there, in which, in the assembled state, each functional state of the motor vehicle lock generates a logical state of the detection device, and in which a control arrangement is provided which is coupled electrically with the signal outputs and, on the basis of this coupling, determines the functional state of the motor vehicle lock, wherein in the assembled state, at least two functional states of the motor vehicle lock generate the same logical state, corresponding to a multiple state of the detection device, wherein these functional states are distinguishable in that an electrical resistance between two predetermined signal outputs of the detection device differs depending on the respective functional state of the motor vehicle lock, and wherein the control arrangement determines the functional state of the motor vehicle lock on the basis of the logical state of the signal outputs and of the electrical resistance between the predetermined signal outputs.

2. The detection device as claimed in claim 1, wherein the electrical resistance between the two predetermined signal outputs corresponds to an electrically conductive connection or tends to infinity, depending on the respective functional state.

3. The detection device as claimed in claim 1, wherein the detection device comprises precisely two signal outputs, and that precisely one multiple state is provided, or that the detection device comprises more than two signal outputs, and at least two multiple states are provided.

4. The detection device as claimed in claim 1, wherein the detection device comprises a sensor arrangement which makes the signal outputs of the detection device available.

5. The detection device as claimed in claim 4, wherein an electrical reference potential is provided, and wherein the sensor arrangement connects the reference potential through to the signal outputs to set a logical state.

6. The detection device as claimed in claim 4, wherein the detection device, when in the assembled state, is associated with at least one adjustable functional element of the motor vehicle lock, and that the logical state of the detection device is determined by the position of the at least one functional element.

7. The detection device as claimed in claim 6, wherein the sensor arrangement comprises at least two sensor switches which, in the assembled state, interact with the at least one functional element of the motor vehicle lock, and whose switching states are determined by the position of the at least one functional element.

8. The detection device as claimed in claim 7, wherein the at least two sensor switches comprise changeover switches, wherein the center contacts of the changeover switches each form one signal output, and wherein a first switch contact of a first changeover switch is connected to a first switch contact of a second changeover switch.

9. The detection device according to claim 4, wherein the sensor arrangement is designed as a sliding track arrangement with sliding tracks designed to be electrically separate from one another, and with a sliding contact which can be repositioned relative to the sliding tracks, and that the sliding contact connects the sliding tracks electrically depending on the position.

10. The detection device according to claim 9, wherein at least two sliding tracks constitute a signal output of the detection device, wherein the reference potential is applied to one sliding track.

11. A motor vehicle lock with a lock mechanism which can be placed in different functional states, and with a detection device for detecting mechanical functional states as claimed in claim 1.

12. The motor vehicle lock as claimed in claim 11, wherein the detection device in the assembled state is associated with at least one adjustable functional element of the motor vehicle lock, and that the logical state of the detection device is determined by the position of the at least one functional element.

13. The motor vehicle lock as claimed in claim 12, wherein the functional element which is associated with the sensor arrangement of the detection device is designed as a control shaft with at least one axial control section for routing control movements out.

14. The motor vehicle lock as claimed in claim 13, wherein the sensor arrangement is designed as a sliding track arrangement, with at least three sliding tracks designed to be electrically separate from one another, and with a sliding contact which can be repositioned relative to the sliding tracks, that the sliding contact connects the sliding tracks electrically depending on the position.

15. A method for detecting mechanical functional states of a motor vehicle lock with the detection device as claimed in claim 1,
comprising determining the functional state of the motor vehicle lock on the basis of the logical state of the signal outputs and of the electrical resistance between predetermined signal outputs.

16. The detection device as claimed in claim 8, wherein a second switch contact of the first changeover switch and a second switch contact of the second changeover switch is connected to a reference potential.

17. The detection device as claimed in claim 16, wherein at least one of the changeover switches has a center position in which the center contact is connected with a third switch contact.

18. The detection device according to claim 9, wherein the sliding contact or the sliding tracks interacts or interact with at least one functional element of the motor vehicle lock, and the position of the sliding contact or of the sliding tracks is determined through the position of the functional element.

19. The motor vehicle lock as claimed in claim 12, wherein the lock mechanism, and with that the motor vehicle lock, can be placed in different functional states comprising a locked state, an unlocked state, a theft-protected state, a locked and child-safe state and an unlocked and child-safe state.

20. The motor vehicle lock as claimed in claim 14, wherein the sliding track arrangement designed as a slip ring arrangement is positioned concentrically on the control shaft.

\* \* \* \* \*